United States Patent [19]

Belmore, III et al.

[11] Patent Number: 5,087,878
[45] Date of Patent: Feb. 11, 1992

[54] TOP-ACCESSIBLE SYSTEM, AND RELATED METHODS, FOR SIMULTANEOUSLY TESTING THE OPPOSITE SIDES OF PRINTED CIRCUIT BOARD

[75] Inventors: Walter J. Belmore, III; Raymond G. Basinger, both of Spring, Tex.

[73] Assignee: Compaq Computer Corporation, Houston, Tex.

[21] Appl. No.: 621,324

[22] Filed: Nov. 30, 1990

[51] Int. Cl.$^5$ ............................................. G01R 1/02
[52] U.S. Cl. ............................. 324/158 F; 324/72.5; 324/158 P
[58] Field of Search ............... 324/158 P, 158 F, 72.5

[56] References Cited

U.S. PATENT DOCUMENTS

| | | | |
|---|---|---|---|
| 3,564,408 | 2/1971 | Schulz et al. | 324/158 |
| 3,757,219 | 9/1973 | Aksu | 324/158 F |
| 4,017,793 | 4/1977 | Haines | 324/158 |
| 4,087,747 | 5/1978 | Deegen et al. | 324/72.5 |
| 4,099,120 | 7/1978 | Aksu | 324/158 F |
| 4,344,033 | 8/1982 | Stowers et al. | 324/158 F |
| 4,352,061 | 9/1982 | Matrone | 324/158 F |
| 4,496,903 | 1/1985 | Paulinski | 324/158 F |
| 4,626,776 | 12/1986 | Wilkinson | 324/158 F |
| 4,626,779 | 12/1986 | Boyle | 324/158 F |
| 4,644,269 | 2/1987 | Golder et al. | 324/158 F |
| 4,667,155 | 5/1987 | Coiner et al. | 324/158 F |
| 4,714,879 | 12/1987 | Krause | 324/158 F |
| 4,746,861 | 5/1988 | Nesbitt | 324/158 F |
| 4,780,086 | 10/1988 | Jenner | 324/158 F |
| 4,797,610 | 1/1989 | Fombellida | 324/158 F |
| 4,803,424 | 2/1989 | Ierardi et al. | 324/158 F |
| 4,818,933 | 4/1989 | Kerschner et al. | 324/158 F |
| 4,829,241 | 5/1989 | Maelzer | 324/158 F |
| 4,841,241 | 6/1989 | Hilz et al. | 324/158 F |
| 4,962,356 | 10/1990 | Eberlein et al. | 324/158 F |
| 4,967,147 | 10/1990 | Woods, Jr. et al. | 324/158 P |

Primary Examiner—Kenneth A. Wieder
Assistant Examiner—William J. Burns
Attorney, Agent, or Firm—Johnson & Gibbs

[57] ABSTRACT

A top-accessible system for simultaneously testing both sides of a printed circuit board includes a vertically movable top plate, upon which the circuit board may be rested, and a framed bottom plate which underlies the top plate and defines a vacuum chamber therewith. A mounting plate is pivoted to the upper side of the top plate for movement to a latched test position over the circuit board. A probe plate is movably carried by and is parallel to the underside of the mounting plate. With the mounting plate in its test position a cam structure thereon is operated to drive the probe plate transversely toward the circuit board to cause upper test pins on the probe plate to perpendicularly contact test points on the upper side of the circuit board, and cause hold-down members on the probe plate to contact the circuit board and firmly hold it against the top plate. The vacuum chamber is then evacuated to draw the top plate toward the bottom plate and cause lower test pins on the bottom plate to move upwardly through openings on the top plate and engage test contact points on the underside of the circuit board. The top ends of the upper test pins are conveniently accessible through a mounting plate opening, and cross-over circuitry is provided which routes the test pin output signals from both the top and bottom sides of the circuit board to beneath the bottom plate.

30 Claims, 4 Drawing Sheets

TOP-ACCESSIBLE SYSTEM, AND RELATED METHODS, FOR SIMULTANEOUSLY TESTING THE OPPOSITE SIDES OF PRINTED CIRCUIT BOARD

BACKGROUND OF THE INVENTION

1. Field of the Invention

This invention relates generally to the testing of electrical apparatus, and, in a preferred embodiment thereof, more particularly relates to the electrical testing of printed circuit boards and the like.

2. Description of Related Art

For purposes of production efficiency and economy it is often desirable to simultaneously test the electrical circuitry on both sides of a printed circuit board. As to either side of a given circuit board a conventional method of testing the circuitry thereon is to longitudinally press resiliently deformable, electrically conductive test pins (such as spring loaded "POGO" pins) against a series of test contact points positioned on the selected board side and suitably connected to various predetermined circuit locations thereon. When the circuit board is operatively connected to an input voltage source, these pins function to conductively interconnect the test contact points on the board to a suitable test circuit connected to the pins and operative to receive and analyze the various electrical test output signals picked up by the pins at the test contact points.

While at first glance this appears to be a rather simple, straightforward electrical test procedure, it is well known that it is subject to a variety of primarily mechanical problems. For example, in order to operatively engage and compress the pins against the test contact points it has been common practice to exert a vacuum force directly against the circuit board to be tested to draw the board into operative contact with the pins.

To accomplish this, the board must be enclosed within a vacuum chamber which also encloses the pins. This typically prevents probe access to the pins during testing, and also hides both the circuit board and the pins from view during testing. There is accordingly no reliable way to verify that the pins are maintained in precise perpendicularity with the circuit board as the pins contact the test points and are longitudinally compressed against them. If such pin/board perpendicularity is not maintained, the pins can be bent or broken, and can be undesirably caused to slide along their associated test contact points.

It is also common practice to use rigid "standoff" members in conjunction with the test pins to contact the circuit board and limit the vacuum-forced movement thereof toward the pins in order to controllably limit the pin compression or "stroke". Using this conventional vacuum drive approach it is difficult to verify whether proper contact is being made between the standoff members and the circuit board. If no such contact is made, the test pin/board contact may be insufficient to provide adequate test results. On the other hand, if the circuit board becomes cocked (thus causing an uneven contact between the stand off members and the board), board damage can occur.

Another problem associated with exerting a vacuum force directly on the circuit board to draw it against test pins is that this approach requires that the board be of an essentially nonperforate construction so as not to appreciably interfere with the vacuum being drawn beneath the board. In the case of perforated or substantially porous boards, this direct vacuum approach is typically not feasible.

Various proposals have been made with a view toward eliminating the vagaries and problems associated with direct vacuum-induced contact between the test pins and the circuit board by mechanically driving the circuit board into contact with a set of test pins. This mechanically-induced contact between the board and test pins is typically achieved by pivotally moving the test pins into engagement with the circuit board, or vice versa. Such pivotal movement, however, can easily cause the pins to non-perpendicularly engage the board test points and cause pin damage and sliding similar to that encountered in vacuum drive systems.

Alternatively, various mechanically driven test systems have previously been proposed in which a more direct movement of the circuit board and test pins toward each other is achieved. However, these systems tend to be relatively complex, and provide only very limited access (if any) to the pins during the actual testing of the circuit board.

Thus far, this background discussion has been directed to the problems, limitations and disadvantages associated with conventional circuit board test systems designed to electrically test only one side of a given circuit board at a time. The difficulties in maintaining test pin/circuit board perpendicularly, preventing the pins from sliding along their associated test contact points, preventing board damage due to improper standoff contact therewith, assuring adequate but not excessive test pin contact stroke, and providing access to and visibility of the pins during testing tend to be significantly increased when opposed series of resiliently deformable pins are used to simultaneously contact and test the opposite sides of a given circuit board.

In view of the foregoing, it is accordingly an object of the present invention to provide an improved system, and associated methods, for simultaneously testing opposite sides of a circuit board in which the above-mentioned and other problems, limitations and disadvantages heretofore associated with conventional test systems are eliminated or substantially reduced.

SUMMARY OF THE INVENTION

In carrying out principles of the present invention, improved apparatus and associated methods are provided for electrically testing a printed circuit board or the like having series of test contact points on its opposite sides. In a preferred overall embodiment of the invention a top-accessible system is provided for simultaneously testing the opposite sides of a circuit board. However, as will be seen, the system incorporates a variety of unique separate features which may also be advantageously utilized in the single-side testing of a circuit board.

According to one feature of the present invention the test system is provided with a generally horizontally disposable base plate structure which includes a framed bottom plate that underlies a vertically movable top plate and forms therewith a vacuum chamber disposed between the plates. The top plate has an upper side surface portion upon which a circuit board may be rested, and means are carried by the top plate for downwardly pressing and holding the circuit board against the top plate. Spring means within the vacuum chamber upwardly bias the top plate to an upper limit position thereof, and upwardly projecting stop means are carried by the bottom plate and function to engage and stop the top plate at a lower limit position thereof.

In its upper limit position the top plate rests upon compressible dam means disposed within the vacuum chamber. These dam means extend around a bottom side surface area of the top plate, positioned beneath and outwardly circumscribing the supported circuit board, and function to isolate the vacuum chamber from the top plate portion directly beneath the circuit board.

Positioned within the compressible dam means are a series of longitudinally resilient, electrically conductive test pins which project upwardly from the bottom plate and are horizontally aligned with associated openings formed through the top plate and underlying a series of bottom side test contact points on the circuit board. With the top plate in its normal upper limit position, the upper ends of the test pins are positioned below the upper side surface of the top plate and do not engage the downwardly facing circuit board test contact points. Accordingly, the circuit board may be initially pressed and held against the top plate before being operatively contacted by the underlying test pins.

To initiate the electrical testing of the operatively supported circuit board the chamber between the top and bottom plates is simply evacuated, thereby causing external ambient pressure to downwardly drive the top plate to its lower limit position in which it vertically compresses the resilient dam means. The overall sealing of the vacuum chamber is preferably augmented by a resilient diaphragm sheet extending across the upper side of the top plate and having an opening through which the circuit board may be placed against and removed from the top plate.

Such downward movement of the top plate, and the circuit board secured thereto, causes the test pins to move upwardly through the aforementioned top plate openings into operative, precisely perpendicular contact with their associate test contact points on the underside of the circuit board. The resulting engagement of the top plate with the underlying stop means automatically limits the longitudinal contact compression stroke of the test pins. When the chamber vacuum is terminated, the top plate is spring-returned to its upper limit position to thereby upwardly disengage the circuit board from the underlying test pins.

Importantly, since the resilient dam means seal off the vacuum chamber from the top plate portion underlying the circuit board during testing of the board, no appreciable amount of inward air leakage occurs through the top plate pin openings. Thus, the fact that a particular circuit board being tested is of a perforated or highly porous construction is of no particular consequence.

According to another aspect of the present invention, the previously mentioned means for downwardly pressing the circuit board against the top plate comprise a uniquely configured top test structure which is operative in conjunction with the base plate structure, and its associated lower test pins, to permit the simultaneous top and bottom side testing of a circuit board.

In an illustrated preferred embodiment thereof, the top test structure includes a mounting plate pivotally secured to the upper side of the top plate for movement relative thereto between a test position in which the mounting plate is parallel to the top plate and overlies the circuit board in an upwardly spaced relationship therewith, and a release position in which the mounting plate is swung away from the circuit board to permit its upward removal from the top plate. Latch means secured to the top plate are operative to releasably lock the mounting plate in its test position.

Supported on the underside of the mounting plate, in a parallel relationship therewith, is a probe plate which is upwardly and downwardly movable relative to the mounting plate, along a first axis transverse thereto, between a first position in which the probe plate is adjacent the mounting plate and a second position in which the probe plate is spaced downwardly apart from the mounting plate. A series of longitudinally resilient upper test pins are secured to the probe plate and project downwardly therefrom along axes parallel to the previously mentioned first axis, and the probe plate is resiliently biased toward its first position by suitable spring means.

With the circuit board operatively positioned on the top plate the mounting plate is pivoted to and latched in its test position. This positions the upper test pins above and precisely perpendicular to the circuit board and in lateral alignment with upper side test contact points thereon. Next, cam means carried by the mounting plate are operated to engage the probe plate and drive it directly downwardly, from its first position to its second position, along the aforementioned first axis. This downward movement of the probe plate drives the upper test pins perpendicularly onto and longitudinally compresses them against the upper side test contact points of the circuit. When a redetermined upper pin stroke has been achieved, downwardly projecting holddown means carried by the probe plate evenly contact the circuit board and press it firmly against the top plate.

Importantly, this structurally uncomplicated top test structure operates to move the upper test pins, throughout their entire downward contact and compression travel, precisely perpendicularly to the circuit board, thereby essentially eliminating the possibility that the upper test pins will be bent, broken, or slid along the upper test contact points on the circuit board. Additionally, since the hold-down means are also moved in this precisely perpendicular fashion, the possibility of circuit board damage caused by "standoff" force is also minimized.

After the upper test pins are brought into operative engagement with the top side of the circuit board, the circuit board is then readied for simultaneous top and bottom side testing simply by evacuating the base structure as previously described to operatively engage the lower test pins with the underside of the circuit board. It should be noted that the vacuum-driven top plate downwardly carries the top pin carrying structure with it so that the movement of the top plate does not disrupt the top hold-down force on the circuit board which stays firmly secured to the moving top plate before, during and after lower test pin engagement with the underside of the circuit board.

It will be readily appreciated by those skilled in this art that the top pin carrying structure just described may be used without the described dual plate base structure, and its associated lower test pins, to provide substantially improved "top side only" testing of a circuit board. This may be achieved simply by operatively securing the top test structure to a stationary base atop which the circuit board may be placed. In a similar fashion, the described vacuum-driven dual plate support base structure may be used by itself, to provide "bottom side only" testing of a circuit board, simply by using means other than the described top test structure to hold the circuit board on the movable top plate.

As will also be appreciated, the test pin portions of the overall test system are connectable to a conventional external test circuit operative to receive and analyze the various electrical test output signals picked up by the pins at the various circuit board test contact points. According to another feature of the present invention, circuit cross-over means are provided which function to conveniently route these test output signals, from both the upper and lower test pins, to beneath the bottom plate, thereby improving top access to the test system.

Such desirable top system access is further enhanced, in accordance with another feature of the present invention, by extending the upper test pins upwardly beyond the top side of the probe plate, and forming through the mounting plate an access opening which overlies the top ends of the upper test pins. With the probe plate in its first position these upper pin ends project into the mounting plate access opening, and with the probe plate in its second position these upper pin ends are both visible and accessible through such mounting plate opening.

For safety purposes the mounting plate access opening is preferably covered by a transparent protective housing which projects upwardly from the top side of the mounting plate. This transparent housing permits the test operator to continuously view the upwardly projecting top test pin ends, and is provided with a removable top panel which selectively permits manual access to the top test pin ends via the mounting plate access opening.

DETAILED DESCRIPTION OF THE INVENTION

Figure 1:
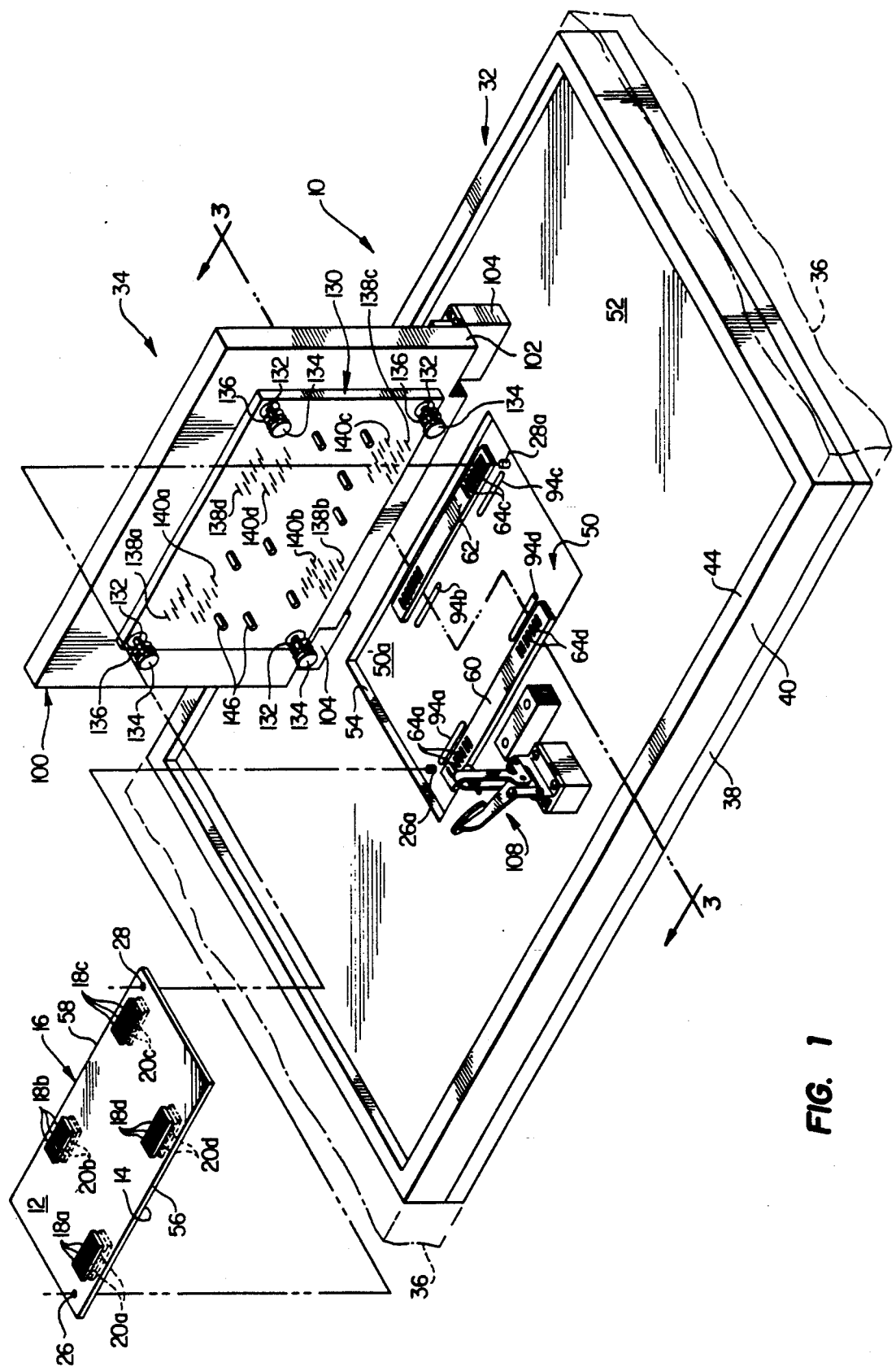
FIG. 1 is a perspective view of a top-accessible circuit board testing system, embodying principles of the present invention, with an upper side testing portion of the system being upwardly pivoted away from a base portion of the system, and a representative circuit board to be tested upwardly exploded away from the base portion.

Perspectively illustrated in FIGS. 1 and 2, and embodying principles of the present invention, is a top-accessible system 10 which, in a manner subsequently described, may be utilized for simultaneously performing electrical tests on the top and bottom sides 12 and 14 of a representative printed circuit board 16 shown in simplified form (i.e., without the circuitry thereon to be tested), and exploded upwardly from the system 10, in FIG. 1. The circuit board 16 has been representatively illustrated as having four spaced apart series of test contact points $18_a$, $18_b$, $18_c$ and $18_d$ mounted on its top side 12, and four correspondingly positioned series of test contact points $20_a$, $20_b$, $20_c$ and $20_d$ (shown phantom in FIG. 1) mounted on its bottom side 14. Additionally, the circuit board 16 is conventionally provided with circular alignment holes 26 and 28 extending through diagonally opposite corner portions thereof.

Figure 3:
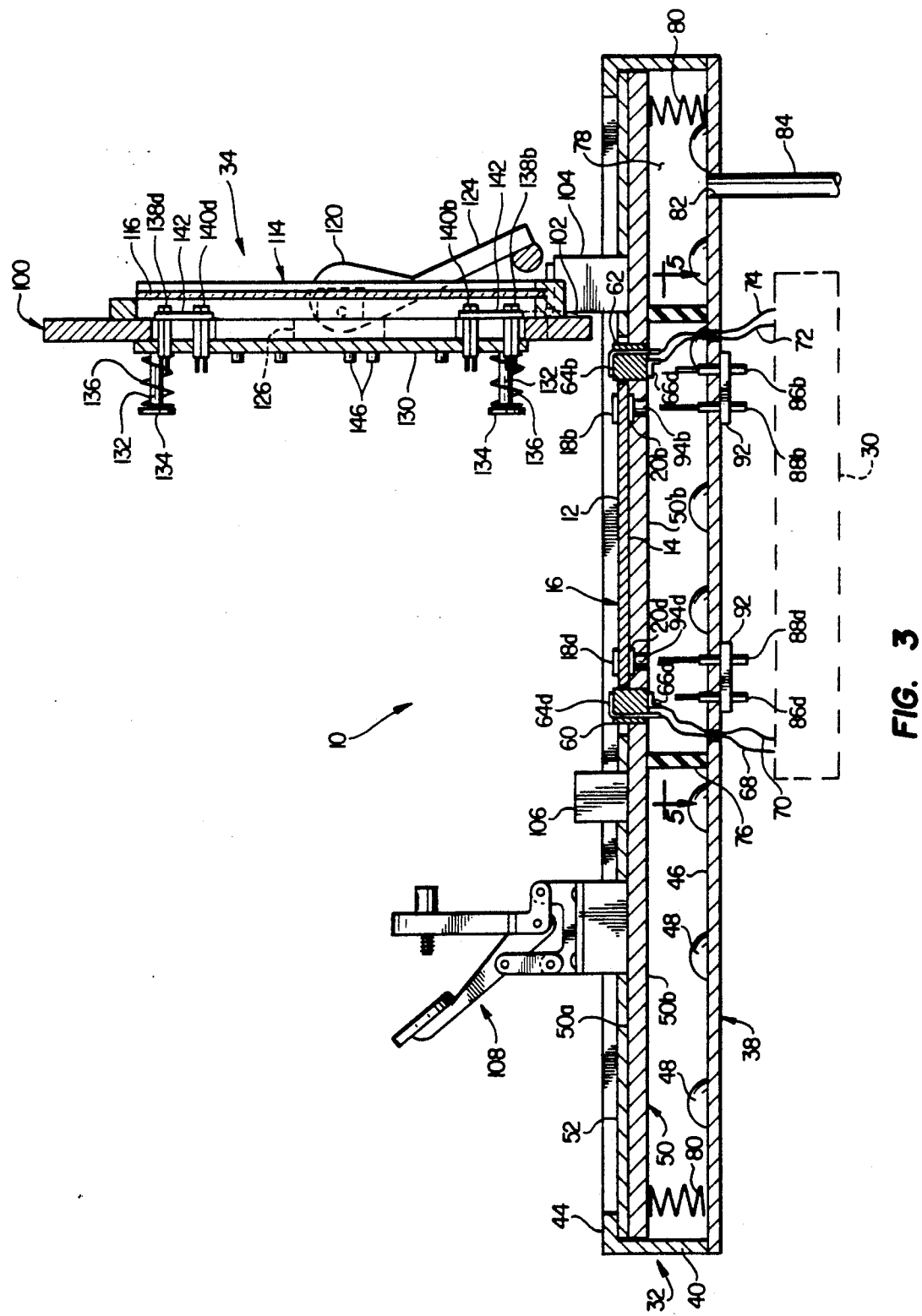
FIG. 3 is a simplified, somewhat schematic cross-sectional view through the system taken along line 3—3 of FIG. 1, with the vertical scale of the system base structure being exaggerated for illustrative clarity.

In general, the system 10 is operative to test the opposite sides of the circuit board 16 by electrically connecting its top and bottom side test contact points 18,20 to a suitable test output signal receiving and analysis circuit 30 (schematically illustrated in phantom in FIG. 3) that may be conveniently located in its entirety beneath the test system 10. With reference now to FIGS. 1 and 3, the test system 10 comprises two basic structures: a base structure 32, and a top test structure 34 pivotally secured to the top side of the base structure 32 in a manner subsequently described.

Base structure 32 has a generally flat, elongated rectangular configuration and, as representatively illustrated in FIG. 1, is generally horizontally supported in a convenient elevated position within an opening in a support structure such as the table top 36 shown in phantom. The lower side of the base structure 32 is defined by an elongated rectangular bottom plate 38 having an upstanding support frame 40 extending around its top side periphery and secured thereto by a spaced series of mounting screws (not illustrated) extending upwardly through the bottom plate. As illustrated, the top peripheral edge of the frame 40 is provided with a horizontally inturned lip 44. For purposes later described, the top side 46 of the bottom plate 38 has secured thereto a spaced series of relatively small, upwardly projecting stop members 48.

A rectangular top plate 50, having top and bottom sides $50_a$ and $50_b$, is slidably disposed within the support frame 40 for vertical movement therein toward and away from the bottom plate 38, the frame lip 44 captively retaining the top plate 50 within the frame as best illustrated in FIG. 3. A flexible rectangular sealing diaphragm sheet 52 is suitably secured to and extends across the upper side $50_a$ of the top plate 50, with a peripheral edge portion of the sheet 52 underlying the frame lip 44 (FIG. 3).

A central rectangular opening 54 is formed through the diaphragm sheet 52, thereby revealing a corresponding rectangular portion $50_a'$ of the upper side of the top plate 50. Projecting upwardly from this top plate upper surface portion $50_a'$ are a pair of alignment pins $26_a$ and $28_a$ which, with the circuit board 16 in its operative position depicted in FIG. 3, extend upwardly through the circuit board alignment holes 26 and 28 to restrain the circuit board against horizontal movement. With the circuit board 16 in such operative position thereof, the bottom side 14 of the board rests against the top plate surface portion $50_a'$ and the board is positioned within the diaphragm sheet opening 54.

The operatively positioned circuit board 16 has front and rear side edges 56 and 58 that are respectively positioned adjacent elongated rectangular blocks 60 and 62 which are suitably secured in elongated openings formed through the top plate 50. Secured to the top side of the block 60 are two series of electrically conductive cross-over strips $64_a, 64_d$ which are aligned with the top test contact points $18_a, 18_d$ and turn downwardly through the top plate 50 into the space between the top and bottom plates 50,38. Two series of electrically conductive bottom cross-over strips $66_a$ and $66_d$ are secured to the underside of the block 60 and are respectively aligned with the bottom test contact points $20_a$ and $20_d$. In a similar fashion, two series of top cross-over strips $64_b$ and $64_c$ are secured to the upper side of the block 62, are respectively aligned with the top test contact points $18_b$ and $18_c$, and turn downwardly through the top plate 50 into the space between the top and bottom plates 50,38. Directly beneath these top cross-over strips $64_b$ and $64_c$ are two series of bottom cross-over strips $66_b$ and $66_c$ which are secured to the underside of block 62 and are respectively aligned with the bottom test contact points $20_b$ and $20_c$. These top and bottom crossover strips are electrically connected to the test output signal receiving and analysis circuit 30, positioned beneath the bottom plate 38, by series of electrical leads 68, 70, 72 and 74 which extend downwardly through the bottom plate 38.

Referring now to FIGS. 1 and 3, a rectangular dam member 76 is interposed between the top and bottom plates 50 and 38 and outwardly circumscribes the operatively positioned circuit board 16 and the top plate blocks 60 and 62. The dam member 76 is formed from a resilient material and contacts and extends between the bottom plate 38 and the underside of the top plate 50 in its upper limit position depicted in FIG. 3. Together with the top and bottom plates 50,38 and the peripheral frame 40, the dam member 76 defines between the plates 38,50 a vacuum chamber 78 through which the top plate 50 may upwardly and downwardly move. The top plate 50 is upwardly biased toward its upper limit position depicted in FIG. 3 by a series of coil spring members 80 which are spaced around the periphery of the vacuum chamber 78 and, at their opposite ends, engage the top and bottom plates 50,38. A circular opening 82 is formed through the bottom plate 38, within the vacuum chamber 78, and is connected to one end of a vacuum hose 84 connected at its opposite end to a vacuum pump (not illustrated).

Importantly, for reasons subsequently discussed, the resilient dam member 76 functions to isolate the vacuum chamber 78 from an underside portion $50_b'$ (FIG. 3) of the top plate 50 which underlies and peripherally borders the operatively positioned circuit board 16 in a manner such that the vacuum chamber 78 outwardly circumscribes the circuit board 16, with no portion of the vacuum chamber directly underlying the circuit board.

Figure 5:
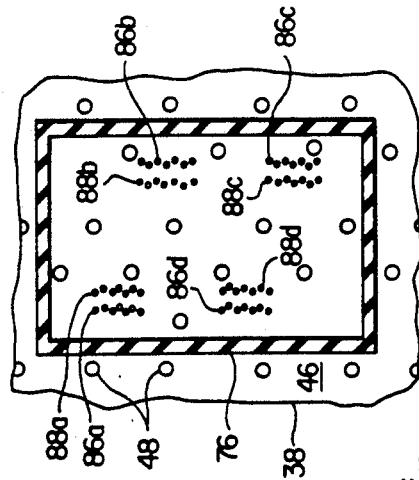
FIG. 5 is a partial cross-sectional view through the base portion of the system taken along line 5—5 of FIG. 3 and illustrating a resilient dam member incorporated in the base portion.

As best illustrated in FIGS. 3 and 5, the base structure 32 also includes a series of electrically conductive, longitudinally resilient lower test pins 86 and 88 which extend transversely through the bottom plate 38 within the interior of the resilient dam member 76. These lower test pins are preferably of the conventional spring-loaded type typically referred to as "POGO" pins. As depicted in FIG. 5, these lower test pins are grouped in sets of parallel, staggered rows $86_a$ and $88_a$, $86_b$ and $88_b$, $86_c$ and $88_c$, and $86_d$ and $88_d$. Top end portions of these four pin sets are disposed above the bottom plate top surface 46, while the bottom ends of the four lower test pin sets project downwardly beyond the bottom plate 38 and are interconnected by four transfer boards 92 (FIG. 3). In a conventional manner, these transfer boards 92 are provided with internal circuitry which electrically interconnects predetermined pairs of the lower ends of the test pins 86,88 to which the particular transfer board 92 is connected.

Respectively underlying the four rows of bottom test contact points $20_a$, $20_b$, $20_c$ and $20_d$ of the circuit board 16 are four slots $94_a$, $94_b$, $94_c$ and $94_d$ formed through the top plate 50 (FIG. 1). With the top plate 50 in its upper limit position (FIG. 3), the upper ends of the lower test pins in rows $86_a$, $86_b$, $86_c$ and $86_d$ respectively underlie and are spaced downwardly apart from the bottom cross-over strip rows $66_a$, $66_b$, $66_c$ and $66_d$. Additionally, the upper ends of the lower test pin rows $88_a$, $88_b$, $88_c$ and $88_d$ are respectively aligned with the top plate slots $94_a$, $94_b$, $94_c$ and 94, with the upper ends of the lower test pins in these latter rows thereof being spaced downwardly apart from the top side $50_a$ of the top plate 50.

Figure 2:
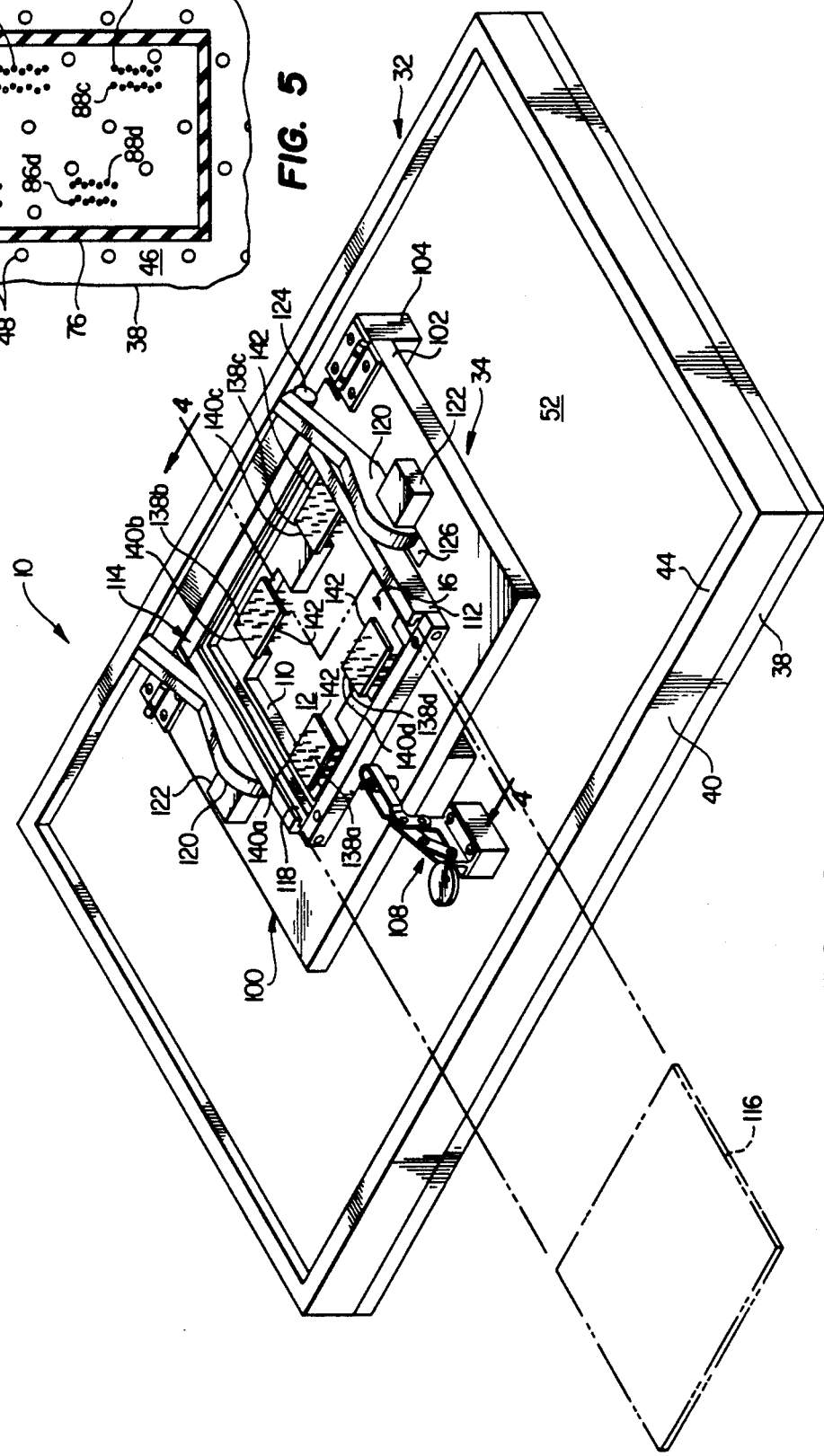
FIG. 2 is a perspective view of the system similar to that in FIG. 1 but with the upper side testing portion being downwardly pivoted to its operative position, and with the circuit board being operatively disposed between the top testing and base portions of the system.

Turning now to FIGS. 1-3, the previously mentioned top test structure 34 includes a rectangular mounting plate 100 which is pivotally secured, along a rear side edge portion 102 thereof, to a pair of pivot blocks 104 secured to the upper side of the top plate 50 and positioned adjacent the rear corners of the rectangular diaphragm sheet opening 54. Mounting plate 100 is rearwardly and upwardly pivotable to a release position (FIG. 1), and is forwardly and downwardly pivotable to a test position (FIG. 2) in which the mounting plate is parallel to the top plate 50 and spaced upwardly apart from the diaphragm sheet 52. With the mounting plate 100 in its test position, a front side edge portion of the mounting plate rests upon the top side of a support block 106 secured to the upper side of the top plate 50 and positioned outwardly adjacent the front side edge of the diaphragm opening 54. A latch structure 108 is secured to the upper side of the top plate 50, forwardly of the support block 106, and is pivotally operable to engage the top side of the mounting plate 100 and firmly hold the mounting plate in its test position (FIG. 2), or to be opened (FIG. 1) to permit the mounting plate 100 to be pivoted upwardly and rearwardly to its release position to permit upward removal of the circuit board 16.

As best illustrated in FIGS. 2 and 3, the mounting plate 100 has a large central access opening 110 formed therethrough, the access opening 110 being bordered by the rectangular frame portion 112 of a transparent plexiglass protective housing 114 which extends above and covers the access opening 110. The protective housing 114 is provided with a transparent top panel 116 which is received within a frame groove 118 and may be forwardly removed from the frame 112, as indicated in phantom in FIG. 2, to uncover the access opening 110.

For purposes later described, a pair of eccentric cam members 120 are pivotally connected to a pair of cam support blocks 122 suitably secured to the upper side of the mounting plate 100 outwardly of left and right ends of the protective housing 114. The cams 120 are linked for conjoint rotation, about an axis parallel to the mounting plate pivot axis, by a generally U-shaped cam handle 124 which may be pivoted in a clockwise direction to a release position (FIG. 2) in which the cams 120 upwardly overlie slots 126 formed through the mounting plate 100, or pivoted in a counterclockwise direction to an operative position (FIG. 4B) in which the cams 120 are driven downwardly through their associated mounted plate slots 126 to beneath the underside of the mounting plate 100.

Beneath the mounting plate 100, and parallel therewith, is a rectangular probe plate 130 which is slidably carried by the mounting plate 100, for transverse upward and downward movement relative thereto, by means of four support rods 132 which are transversely secured to the underside of the mounting plate 100 and extend downwardly through corresponding circular openings in the probe plate 130. Lower end portions of the rods 132 project downwardly beyond the probe plate 130 and are provided with enlarged bottom end portions 134. The probe plate 130 is upwardly biased into engagement with the underside of the mounting plate 100 by four coil spring members 136 which encircle the lower end portions of the rods 132 and bear against the enlarged rod ends 134 and the underside of the probe plate 130.

Mounted on the probe plate 130 are two series of electrically conductive, longitudinally resilient upper test pins 138 and 140 which are similar in construction and operation to the previously described lower test pins 86,88. The upper test pins 138,140 project transversely through the probe plate 130, with upper and lower end portions of the pins respectively projecting upwardly and downwardly beyond the upper and lower sides of the probe plate. Upper test pins 138,140 are arranged on the probe plate in four sets of two parallel, staggered pin rows $138_a$ and $140_a$, $138_b$ and $140_b$, $138_c$ and $140_c$ and $138_d$ and $140_d$. These four pin sets are arranged on the probe plate in a manner such that, with the mounting plate 100 moved to its test position (FIG. 2), lower end portions of the pins $138_a$, $138_b$, $138_c$ and $138_d$ respectively overlie the upper cross-over strips $64_a$, $64_b$, $64_c$ and $64_d$ of the operatively positioned circuit board 16, and lower end portions of the test pins $140_a$, $140_b$, $140_c$ and $140_d$ respectively overlie the circuit board top side test contact points $18_a$, $18_b$, $18_c$ and $18_d$.

The upwardly projecting top end portions of the upper test pins 138 and 140 are positioned inwardly of the periphery of the mounting plate access opening 110, and the top end portions of the pin sets $138_a$ and $140_a$, $138_b$ and $140_b$, $138_c$ and $140_c$, and $138_d$ and $140_d$ are conductively interconnected in a predetermined manner by transfer boards 142 similar in construction and operation to the previously described transfer boards 92.

A spaced series of cylindrical hold-down rods 146 are secured to and project transversely downwardly from the underside of the probe plate 130. The lengths of the hold-down rods 146 are somewhat less than the uncompressed lengths of the downwardly projecting lower end portions of the upper test pins 138 and 140.

The top-accessible test system 10 is utilized by first upwardly pivoting the mounting plate 100 to its release position shown in FIGS. 1 and 3. In this pre-test position of the system 10, the cam handle 124 is pivoted to its release position in which the handle extends along a rear top side portion of the mounting plate 100, the probe plate 130 is in its upwardly biased position against the underside of the mounting plate 100, and the top plate 50 of the base structure 32 (FIG. 3) is in its upper limit position. The circuit board 16 is then operatively positioned upon the upper side of the top plate 50 as previously described.

Next, the mounting plate 100 is downwardly pivoted to its test position (FIG. 4A) and the latch structure 108 is operated to downwardly engage the mounting plate and firmly but releasably hold it in such test position thereof. With the mounting plate 100 latched in its test position, the lower end portions of the upper test pins $138_a$, $138_b$, $138_c$ and $138_d$ are respectively spaced upwardly apart from and operatively aligned with the upper cross-over strips $64_a$, $64_b$, $64_c$ and $64_d$, and the lower end portions of the upper test pins $140_a$, $140_b$, $140_c$ and $140_d$ are respectively spaced upwardly apart from and operatively aligned with the circuit board top side test contact points $18_a$, $18_b$, $18_c$ and $18_d$. Additionally, the lower ends of the hold-down rods 146 are spaced upwardly apart from the top side of the operatively positioned circuit board 16.

Figure 4A:
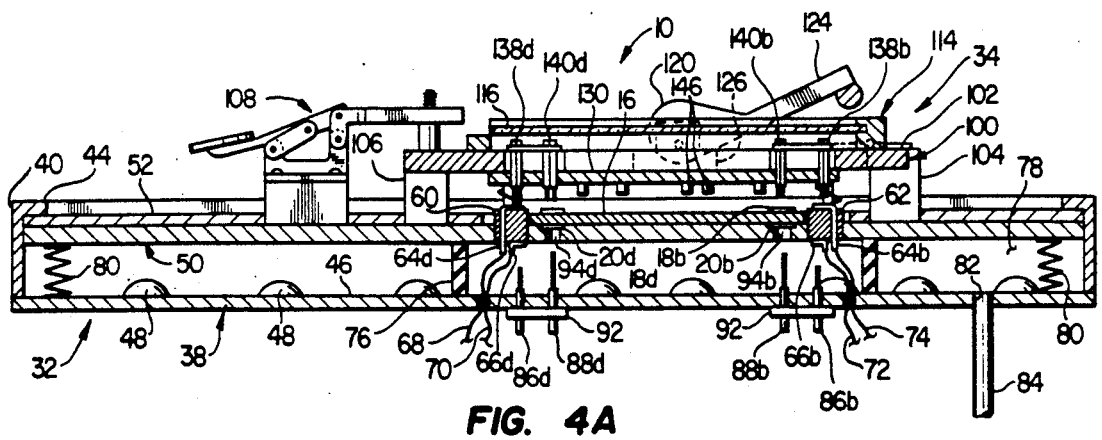
FIGS. 4A–4C are simplified, somewhat schematic cross-sectional views through the system, taken along line 4—4 of FIG. 2, and sequentially illustrate the operation of the system during use in the simultaneous electrical testing of the top and bottom sides of the circuit board, the vertical scale of the system base portion being exaggerated for illustrative clarity.
Figure 4B:
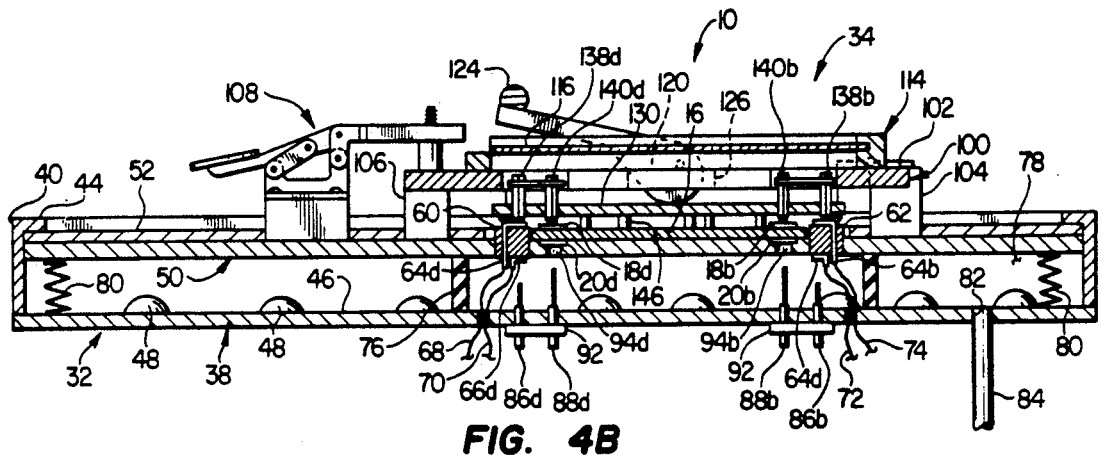

Next, the cam handle 124 is rotated 180 in a counterclockwise direction from its release position shown in FIG. 4A to its drive position shown in FIG. 4B. This causes the cams 120 to be rotated downwardly through their associated mounting plate slots 126 to engage the top side of the probe plate 130 and drive the probe plate downwardly apart from the mounting plate 100, against the resilient biasing force of the springs 136, to the operatively lowered position of the probe plate 130 shown in FIG. 4B.

This downward, mechanically driven movement of the probe plate 130 relative to the mounting plate 100 occurs along an axis which is precisely perpendicular to the mounting plate 100 and the top plate 50, and causes the bottom end portions of the upper test pins $138_a$, $138_b$, $138_c$ and $138_d$ to perpendicularly engage and be longitudinally compressed against their associated top cross-over strips $64_a$, $64_b$, $64_c$ and $64_d$, and also causes the lower end portions of the upper test pins $140_a$, $140_b$, $140_c$ and $140_d$ to perpendicularly contact and be longitudinally compressed against their associated circuit board test contact points $18_a$, $18_b$, $18_c$ and $18_d$. As the upper test pins 138 and 140 reach the limit of their predetermined longitudinal compression strokes, the lower ends of the hold-down rods 146 are brought into contact with the top side of the circuit board 16 to thereby firmly hold the circuit board in its operative position.

The operative engagement between the upper test pins and their associated upper test contact points 18 and top cross-over strips 64 creates a series of test subcircuits which sequentially extend from the top test contact points 18 through the pins 140, through the transfer board 142 above the probe plate 130 and through the pins 138 to the cross-over strips 64. These test subcircuits are then connected to the test output signal receiving and analysis circuit 30 via the various electrical leads 68 and 74.

Figure 4C:
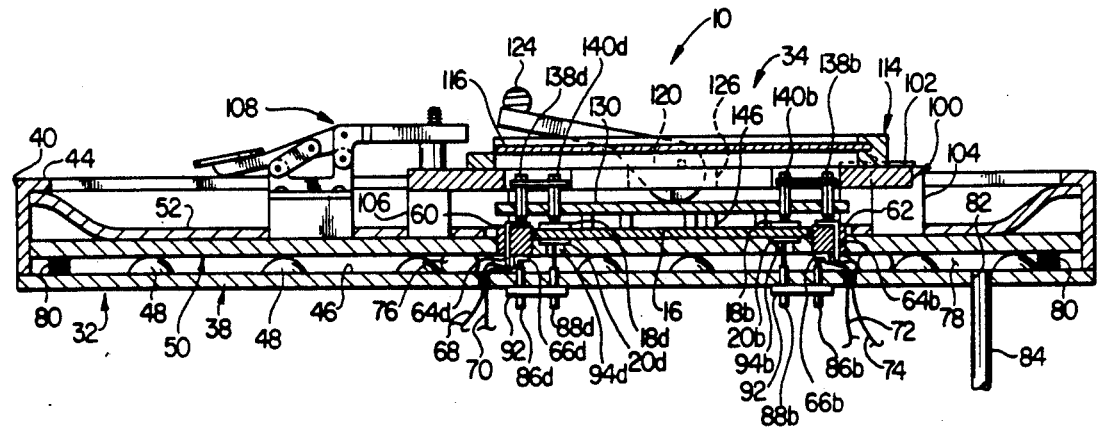

Finally, as depicted in FIG. 4C, the system vacuum pump is energized to evacuate the base structure chamber 78, thereby causing the top plate 50 to be driven downwardly to its lower limit position in which the underside of the top plate 50 engages the bottom plate stop members 48. This downward movement of the top plate 50 compresses the resilient dam member 76 as depicted in FIG. 4C. The downward movement of the top plate 50 also causes upper end portions of the lower test pins $86_a$, $86_b$, $86_c$ and $86_d$ to perpendicularly engage and be longitudinally compressed against their associated bottom cross-over strips $66_a$, $66_b$, $66_c$ and $66_d$ and also causes upper end portions of the lower test pins $88_a$, $88_b$, $88_c$ and $88_d$ to respectively pass upwardly through the top plate slots $94_a$, $94_b$, $94_c$ and $94_d$ to perpendicularly engage and be longitudinally compressed against the bottom side test contact points $20_a$, $20_b$, $20_c$ and $20_d$.

This operative engagement between the lower test pins and their associated cross-over strips 64 and bottom test contact points 20 creates a series of test subcircuits sequentially extending from the bottom side test points 20 to the pins 88, through the transfer boards 92, and through the pins 86 to the bottom cross-over strips 66. These test subcircuits are operatively connected to the test output signal receiving and analysis circuit 30 via the various electrical leads 70 and 72. This readies the operatively positioned circuit board 16 for simultaneous electrical testing of its top and bottom sides.

The testing system 10 of the present invention provides a variety of operational advantages compared to conventional systems used to simultaneously test the top and bottom sides of a printed circuit board or the like. For example, and quite importantly, since the probe plate 130 is downwardly translated from its FIG. 4A position to its FIG. 4B position along an axis precisely parallel to the axes of the upper test pins which, in turn, are precisely perpendicular to the circuit board 16, the upper test pins are maintained precisely perpendicular to the circuit board from their initial contact with the upper test points thereon throughout the full operative longitudinal compression stroke of the upper test pins. Accordingly, throughout the entire operative contact between the upper test pins and the upper test contact points on the circuit board, there is no appreciable lateral movement of the pins relative to their associated test contact points, and there are no appreciable lateral forces imposed upon the upper test pins. This advantageously eliminates the previous problems of causing test pins to slide across their associated test contact points and/or be subject to bending or breakage.

Additionally, the provision of the mounting plate opening 110 which overlies the top ends of the upper test pins conveniently permits these top pin ends to be probed during the operative testing of the top and bottom sides of the circuit board. All that is necessary to effect this desirable probing is to remove the top panel 116 of the transparent protective housing 114. Even with this top panel 116 in place, however, the test operator may still view the top ends of the upper test pins to verify that the upper test pins are properly stroked when the system 10 is in its FIG. 4C operative position.

Moreover, the use of the previously described upper and lower cross-over strips advantageously permits the test output signal receiving and analysis circuit 30 to be positioned beneath the base structure 32, thereby further facilitating a very desirable top access to the overall system 10.

The previously described top test structure 34 is of a very simple, rugged and reliable construction, and may be quite easily and rapidly used. As can be seen in FIG. 4C, when the top plate 50 is vacuum-drawn downwardly to its lower limit position, the entire top test structure 34 is drawn downwardly with the top plate 50. Accordingly, the circuit board hold-down force of the previously described hold-down rods 146 is maintained throughout the vertical stroke of the top plate 50 to provide a secure resistance force against which the lower test pins may be operatively compressed against their associated lower cross-over strips and bottom side test contact points as previously described.

The test system 10 is provided with a further operational advantage via its unique incorporation of the resilient dam member 76 interposed between the top and bottom plates 50,38 of the base structure 32. Specifically, as previously described, the use of this resilient dam member 76 effectively isolates the vacuum chamber 78 from the underside portion of the top plate that underlies the operatively positioned circuit board 16. Accordingly, any openings extending through the circuit board, or its underlying top plate portion, do not communicate with the vacuum chamber and accordingly cannot disrupt or interfere with the vacuum being maintained therein. This desirably permits the test system 10 to be used in conjunction with perforated or porous circuit boards without adversely affecting the operation of the test system.

It will be appreciated by those skilled in this art that while the various features of the present invention have been illustratively combined in a system operable to simultaneously test the top and bottom sides of a printed circuit board or the like, such features could be individually utilized to provide a system operative to test just the top side of a circuit board, or to test just its bottom side. For example, if desired, the top test structure 34 could be eliminated, and the circuit board releasably held against the upper side of the top plate 50 by other means to test only the bottom side of the circuit board when a vacuum is created within the chamber 78 of the base structure 32. Conversely, to test only the top side of the circuit board 16, the base structure 32 could be formed simply as a single plate to which the top test structure 34 is pivotally mounted.

The foregoing detailed description is to be clearly understood as being given by way of illustration and example only, the spirit and scope of the present invention being limited solely by the appended claims.

What is claimed:

1. A method of electrically testing a circuit board or the like having a first side with a series of test contact points thereon, and an oppositely facing second side, said method comprising the steps of:

operatively positioning said circuit board, second side down, on the upper side of a base structure;

providing a probe structure having a series of parallel, longitudinally resilient, electrically conductive upper test pins, and a series of essentially rigid hold-down members, projecting outwardly therefrom, said probe and mounting structures, respectively, being parallel probe and mounting plates, said upper test pins projecting through said probe plate toward said mounting plate;

securing a mounting structure to said base structure for movement relative thereto;

attaching said probe structure to said mounting structure for movement therewith, and for translational movement relative thereto in a direction parallel to the axes of said upper test pins;

moving said mounting structure relative to said base structure to a test position in which said upper test pins are perpendicular to and spaced upwardly apart from the operatively positioned circuit board, and are laterally aligned with said test contact points;

releasably restraining said mounting structure against movement away from said test position;

downwardly translating said probe structure relative to said mounting structure in a manner causing said upper test pins to perpendicularly engage and be compressed against said test contact points, without appreciable lateral movement relative thereto, and causing said hold-down members to engage the operatively positioned circuit board and rigidly resist its upward movement relative to said base structure; and forming an opening through said mounting plate which overlies and permits top access to said upper test pins during electrical testing of the operatively positioned circuit board.

2. The method of claim 1 further comprising the step of:

enclosing said mounting plate opening with a transparent protective housing having a movable top wall portion permitting selective top access to said upper test pins, through said protective housing and said mounting plate opening, during electrical testing of the operatively positioned circuit board.

3. A method of electrically testing a circuit board or the like having a first side with a series of test contact points thereon, and an oppositely facing second side, said method comprising the steps of:

operatively positioning said circuit board, second side down, on the upper side of a base structure;

providing a probe structure having a series of parallel, longitudinally resilient, electrically conductive upper test pins, and a series of essentially rigid hold-down members, projecting outwardly therefrom, said probe and mounting structures, respectively, being parallel probe and mounting plates, with said probe plate being resiliently biased toward said mounting plate;

securing a mounting structure to said base structure for movement relative thereto;

attaching said probe structure to said mounting structure for movement therewith, and for translational movement relative thereto in a direction parallel to the axes of said upper test pins;

moving said mounting structure relative to said base structure to a test position in which said upper test pins are perpendicular to and spaced upwardly apart from the operatively positioned circuit board, and are laterally aligned with said test contact points;

releasably restraining said mounting structure against movement away from said test position; and downwardly translating said probe structure relative to said mounting structure in a manner causing said upper test pins to perpendicularly engage and be compressed against said test contact points, without appreciable lateral movement relative thereto, and causing said hold-down members to engage the operatively positioned circuit board and rigidly resist its upward movement relative to said base structure, said downwardly translating step being performed by:

forming opening means transversely through said mounting plate, mounting cam means on the top side of said mounting plate, and operating said cam means to cause them to pass downwardly through said opening means, engage the top side of sid probe plate, and downwardly drive said probe plate away from said mounting plate.

4. The method of claim 1 wherein:

said base structure includes a bottom plate, means for defining a vacuum chamber extending upwardly from a top side of said bottom plate, and a top plate overlying said bottom plate, in a parallel relationship therewith, and being transversely movable through said vacuum chamber toward and away from said bottom plate, said bottom plate has a series of upwardly projecting longitudinally resilient, electrically conductive lower test pins thereon which underlie opening means formed through said top plate, said circuit board has a series of bottom side test contact points thereon, said operatively positioning step is performed by placing said circuit board on said top plate in a manner such that said bottom side test contact points overlie said top plate opening means, said securing step is performed by securing said mounting structure to and above said top plate for movement therewith toward and away from said bottom plate, and said method further comprises the step of evacuating said vacuum chamber to move said top plate toward said bottom plate and cause said lower test pins to be moved upwardly through said top plate opening means and perpendicularly contact and be longitudinally compressed against said bottom side test contact points of the operatively positioned circuit board.

5. The method of claim 4 further comprising the step of:

isolating said vacuum chamber from a bottom side portion of said top plate which underlies and peripherally circumscribes the operatively positioned circuit board.

6. The method of claim 5 wherein said isolating step includes the step of:

interposing a resiliently compressible dam member between said top and bottom plates.

7. The method of claim 4 further comprising the steps of:

generating top and bottom test output signals from the test contact points on the top and bottom sides of the operatively positioned circuit board through said upper and lower test pins, and routing said top and bottom test output signals from said upper and lower test pins downwardly through said bottom plate.

8. Apparatus for electrically testing a circuit board or the like having a first side surface with a series of test contact points thereon, and an oppositely facing second side surface, said apparatus comprising:

a base structure having a side portion against which said second side surface of the circuit board may be operatively positioned;

a plate member having a first side surface from which a spaced series of electrically conductive test pins transversely project, and a second side surface;

means for connecting said plate member to said base structure for movement relative thereto toward and away from a first position in which said plate member outwardly overlies the operatively positioned circuit board, with said first plate member side surface facing the circuit board, and said test pins are in operative lateral alignment with the circuit board test contact points, are perpendicular to the circuit board, and are spaced outwardly apart from the circuit board; and means, supported for movement with said plate member and operable after said plate member has been moved to said first position, for engaging said second plate member side surface and drivingly translating said plate member transversely toward the circuit board to a second position in which said test pins are brought into operative perpendicular engagement with the circuit board test contact points without imposing appreciable transverse forces on said test pins or causing appreciable movement thereof along said test contact points, said means for engaging said second plate member side surface including a cam structure rotatable, about an axis generally parallel to said second plate member side surface, into driving engagement with said second plate member side surface.

9. The apparatus of claim 8 further comprising:
means for releasably latching said plate member in said first position, and
means projecting transversely outwardly from said second plate member side surface and operative to engage the circuit board, and hold it firmly against said base structure.

10. The apparatus of claim 8 further comprising:
a spaced plurality of hold-down members, secured to said first plate member side surface and projecting transversely outwardly therefrom, for engaging the operatively positioned circuit board and pressing it against said base structure side portion when said plate member is moved from its first position to its second position.

11. The apparatus of claim 10 wherein:
said test pins are longitudinally and resiliently compressible, and
said test pins and said hold-down members are relatively configured and positioned on said plate member in a manner such that as said plate member is moved from its first position to its second position said test pins engage the circuit board test contact points, and are longitudinally compressed, prior to the operative engagement of said hold-down members with the circuit board.

12. Apparatus for electrically testing a circuit board or the like having a side surface with a series of test contact points thereon, said apparatus comprising:
a base structure having an upper side against which the circuit board may be operatively positioned with said side surface thereof facing upwardly;
a first member having upper and lower sides;
a second member,
means for supporting said second member on said lower side of said first member for upwardly translational movement relative thereto to a first position, and downward translational movement relative thereto to a second position, along a first axis;
means for resiliently biasing said second member toward its first position;
a series of electrically conductive, longitudinally resilient test pins secured to said second member and longitudinally projecting downwardly therefrom along axes parallel to said first axis;
means for securing said first member to said base structure for movement relative thereto between a test position in which, with said second member in said first position thereof, said test pins are disposed above and perpendicularly to the operatively positioned circuit board, and are laterally aligned with associated ones of said test contact points, and a release position in which said first member is moved away from the circuit board to permit its upward removal from said base structure;
means for releasably holding said first member in said test position thereof; and
means carried by said first member and selectively operable to force said second member downwardly along said first axis from said first position to said second position, after said first member has been moved to said test position thereof, to thereby bring said test pins directly downwardly into operative, longitudinally compressed engagement with the circuit board test points without imposing appreciable lateral forces on said pin members upon or after their initial engagement with the circuit board test points.

13. The apparatus of claim 12 wherein:
said first and second members, respectively, are parallel first and second plate members,
said means for supporting include support rod members extending downwardly from said first plate member and transversely through said second plate member, said rod members slidably carrying said second plate member for movement between said first and second positions thereof, and
said means for resiliently biasing include spring means, carried by said rod members, for resiliently forcing said second plate member toward said first plate member.

14. The apparatus of claim 12 wherein:
said first and second members, respectively, are parallel first and second plate members,
said means for securing said first member to said base structure include means for securing said first plate member to said base structure for pivotal movement relative thereto, between said test and release positions, about an axis generally parallel to said upper side of said base structure, and
said first plate member, when in said test position thereof, extends generally parallel to said upper side of said base structure.

15. The apparatus of claim 14 wherein said means for releasably holding said first member include:
latch means secured to said upper side of said base structure and operative to selectively contact the upper side of said first plate member and releasably hold said first plate member in said test position thereof.

16. The apparatus of claim 12 wherein said means selectively operable to force said second member downwards along said first axis include:
cam means rotatably supported on the upper side of said first member and selectively operable to engage the top side of said second member and downwardly drive said second member from said first position to said second position against the upward force of said means for resiliently biasing said second member.

17. The apparatus of claim 16 wherein:
said first member has a spaced pair of slots therein which extend between said upper and lower sides, and
said cam means include a pair of cam members rotatably supported over said slots, and means linking said cam members and rotatable to selectively move said cam members downwardly through said slots into driving engagement with the top side of said second member.

18. The apparatus of claim 12 wherein:
said test pins have upper end portions which extend upwardly beyond the top side of said second member, and said first member has an opening formed therethrough which overlies and permits top access to said pin members during electrical testing of the operatively positioned circuit board.

19. The apparatus of claim 18 further comprising:
a protective housing structure secured to the upper side of said first member over said opening therein, said housing structure having movable top wall means operable to selectively permit and preclude said top access to said pin members.

20. The apparatus of claim 19 wherein:
said protective housing structure is formed from a transparent material.

21. The apparatus of claim 12 further comprising:
a spaced plurality of hold-down members, secured to said second member and projecting downwardly therefrom, for engaging the operatively positioned circuit board and pressing it downwardly against said upper side of said base structure when said second member is moved to and held in its second position.

22. The apparatus of claim 21 wherein:
said test pins and said hold-down members are relatively configured and positioned on said second member in a manner such that as said second member is moved to its second position said test pins engage the circuit board test contact points, and are longitudinally compressed, prior to the operative engagement of said hold-down members with the circuit board.

23. The apparatus of claim 12 wherein:
said test pins include a first test pin set positioned to operatively engage a first set of said circuit board test contact points when said first member is brought to its test position, and a second test pin set electrically connected to said first test pin set, and
said apparatus further comprises conductive transfer means carried on the upper side of said base structure outwardly of the operatively positioned circuit board for engagement by said second test pin set when said first member is moved to its test position, said conductive transfer means being connectable from the bottom side of said base structure to a test circuit and operative to permit electrical test signals to sequentially pass from said first set of circuit board test contact points, through said first test pin set, through said second test pin set, and downwardly through said conductive transfer means to the test circuit connected thereto.

24. The apparatus of claim 12 wherein:
said circuit board has a series of bottom side test contact points thereon,
said base structure includes a bottom plate having a top side upwardly from which a series of electrically conductive, longitudinally resilient lower test pins transversely project; means for defining a vacuum chamber extending upwardly from said top side of said bottom plate; a top plate overlying said bottom plate in an upwardly spaced, parallel relationship with said top side of said bottom plate, said top plate having a top side surface defining the portion of said upper side of said base structure against which the circuit board may be operatively positioned; and opening means formed through said top plate and positioned beneath said bottom side test contact points of the operatively positioned circuit board and in alignment with said lower test pins,
said means for securing said first member to said base structure are operative to secure said first member to and above said top plate,
said apparatus further comprises means, associated with said second member, for holding the operatively positioned circuit board against said top side surface of said top plate when said second member is in said second position thereof, and
said top plate is movable through said vacuum chamber transversely toward said bottom plate, in response to evacuation of said vacuum chamber, in a manner causing said lower test pins to move upwardly through said top plate opening means and transversely contact and be longitudinally compressed against said bottom side test contact points of the operatively positioned circuit board.

25. The apparatus of claim 24 further comprising:
means for isolating said vacuum chamber from a portion of the bottom side of said top plate which underlies and peripherally circumscribes the operatively positioned circuit board.

26. The apparatus of claim 25 wherein said means for isolating include:
a resiliently compressible dam member interposed between said top and bottom plates.

27. The method of claim 3 wherein:
said base structure includes a bottom plate, means for defining a vacuum chamber extending upwardly from a top side of said bottom plate, and a top plate overlying said bottom plate, in a parallel relationship therewith, and being transversely movable through said vacuum chamber toward and away from said bottom plate,
said bottom plate has a series of upwardly projecting, longitudinally resilient, electrically conductive lower test pins thereon which underlie opening means formed through said top plate,
said circuit board has a series of bottom side test contact points thereon,
said operatively positioning step is performed by placing said circuit board on said top plate in a manner such that said bottom side test contact points overlie said top plate opening means,
said securing step is performed by securing said mounting structure to and above said top plate for movement therewith toward and away from said bottom plate, and
said method further comprises the step of evacuating said vacuum chamber to move said top plate toward said bottom plate and cause said lower test pins to be moved upwardly through said top plate opening means and perpendicularly contact and be longitudinally compressed against said bottom side test contact points of the operatively positioned circuit board.

28. The method of claim 27 further comprising the step of:
isolating said vacuum chamber from a bottom side portion of said top plate which underlies and peripherally circumscribes the operatively positioned circuit board.

29. The method of claim 28 wherein said isolating step includes the step of:
interposing a resiliently compressible dam member between said top and bottom plates.

30. The method of claim 27 further comprising the steps of:
generating top and bottom test output signals from the test contact points on the top and bottom sides of the operatively positioned circuit board through said upper and lower test pins, and
routing said top and bottom test output signals from said upper and lower test pins downwardly through said bottom plate.

* * * * *

UNITED STATES PATENT AND TRADEMARK OFFICE
CERTIFICATE OF CORRECTION

PATENT NO. : 5,087,878
DATED : February 11, 1992
INVENTOR(S) : Belmore, III et al.

It is certified that error appears in the above-identified patent and that said Letters Patent is hereby corrected as shown below:

Title page, item [54], "SIDES OF PRINTED" should be --SIDES OF A PRINTED--.

Column 13, line 60, "sid" should be --said--.

Column 16, line 48, "can" should be --cam--.

Signed and Sealed this

Seventeenth Day of August, 1993

Attest:

Attesting Officer

BRUCE LEHMAN

Commissioner of Patents and Trademarks